(12) United States Patent
Legendre et al.

(10) Patent No.: US 11,219,139 B2
(45) Date of Patent: Jan. 4, 2022

(54) ASSEMBLY COMPRISING AN ELECTRICAL DEVICE, A PRESSING MEMBER AND A PART FOR HOLDING THE PRESSING MEMBER

(71) Applicant: Valeo Siemens eAutomotive France SAS, Cergy (FR)

(72) Inventors: Alexandre Legendre, Jouy-le-Moutier (FR); Aurélien Pouilly, Poissy (FR)

(73) Assignee: VALEO SIEMENS EAUTOMOTIVE FRANCE SAS, Cergy (FR)

( * ) Notice: Subject to any disclaimer, the term of this patent is extended or adjusted under 35 U.S.C. 154(b) by 0 days.

(21) Appl. No.: 16/720,851

(22) Filed: Dec. 19, 2019

(65) Prior Publication Data
US 2020/0205311 A1 Jun. 25, 2020

(30) Foreign Application Priority Data
Dec. 21, 2018 (FR) ...................................... 1873808

(51) Int. Cl.
H05K 7/14 (2006.01)
H05K 7/20 (2006.01)
H01L 23/40 (2006.01)

(52) U.S. Cl.
CPC ........... H05K 7/2049 (2013.01); H01L 23/40 (2013.01); H05K 7/1401 (2013.01); H05K 7/2089 (2013.01)

(58) Field of Classification Search
None
See application file for complete search history.

(56) References Cited

U.S. PATENT DOCUMENTS

| | | | |
|---|---|---|---|
| 7,206,204 B2* | 4/2007 | Nakatsu | H01L 23/4006 165/80.3 |
| 9,545,032 B2* | 1/2017 | Baer | H05K 7/2039 |
| 2008/0128895 A1* | 6/2008 | Oman | H01L 23/3675 257/712 |
| 2008/0137300 A1* | 6/2008 | Macris | H01L 24/32 361/699 |

(Continued)

FOREIGN PATENT DOCUMENTS

| DE | 102013109532 B3 | 8/2014 |
|---|---|---|
| EP | 2172971 A2 | 4/2010 |

(Continued)

OTHER PUBLICATIONS

French Search Report for Application No. 1873808 dated Oct. 4, 2019.

*Primary Examiner* — Courtney L Smith
(74) *Attorney, Agent, or Firm* — McCormick, Paulding & Huber PLLC

(57) ABSTRACT

The invention relates to an assembly including:
- at least one electrical device comprising a first face for being pressed against a surface,
- at least one pressing member positioned on a second face of the electrical device opposite to the first face, said pressing member being intended to participate in pressing said electrical device on said surface,
- at least one holding part which holds said pressing member on the second face of said electrical device by being attached around the pressing member on a peripheral portion of the electrical device.

15 Claims, 5 Drawing Sheets

(56) References Cited

U.S. PATENT DOCUMENTS

| | | | | |
|---|---|---|---|---|
| 2008/0158824 A1* | 7/2008 | Aoki | ............ | H01L 24/40 |
| | | | | 361/711 |
| 2013/0119908 A1* | 5/2013 | Harada | ............ | H05K 7/026 |
| | | | | 318/400.42 |
| 2019/0052149 A1* | 2/2019 | Mergener | ............ | H05K 1/181 |
| 2019/0221497 A1* | 7/2019 | Takada | ............ | H01L 23/4006 |
| 2019/0335608 A1* | 10/2019 | Song | ............ | H05K 7/20872 |

FOREIGN PATENT DOCUMENTS

| | | |
|---|---|---|
| JP | 2000223630 A | 8/2000 |
| WO | 2014033382 A1 | 3/2014 |

* cited by examiner

ASSEMBLY COMPRISING AN ELECTRICAL DEVICE, A PRESSING MEMBER AND A PART FOR HOLDING THE PRESSING MEMBER

CROSS-REFERENCE TO RELATED APPLICATION

This application claims foreign priority benefits under 35 U.S.C. § 119 to French Patent Application No. 1873808 filed on Dec. 21, 2018, the content of which is hereby incorporated by reference in its entirety.

TECHNICAL FIELD

The present invention relates to an assembly comprising an electrical device, a pressing member and a part for holding the pressing member. The invention also relates to an electrical equipment comprising such an assembly. Such an electrical equipment can be a power inverter, a voltage converter or an electrical charger of a battery, in particular configured to be onboard an electric or hybrid automobile vehicle.

BACKGROUND

In applications of electric or hybrid vehicle, electric voltages can be high, for example between 200V and 800V. Heat generation by Joule effect can then become significant with the risk of damaging pieces of electrical equipment of the vehicle.

In order to avoid any degradation by heat, an electrical equipment generally comprises a cooling system. It is known to use a pressing member for pressing an electrical device of the electrical equipment against a surface of the cooling system to improve cooling of the electrical device. For example, in a power inverter onboard an electric or hybrid vehicle, an electric device, such as a capacitive block, is known. The capacitive block comprises one or more capacitors connected by a positive conductor and a negative conductor. Typically, the capacitive block is secured to a chassis of the power inverter to be pressed against the cooling system of the power inverter. On the face of the capacitive block which is opposite to the cooling system, a pressing member bears on the capacitive block to press it against the cooling system. Generally, the pressing member is first mounted on a first part of the chassis, the capacitive block is mounted on a second part of the chassis which comprises the cooling system. Then, both parts of the chassis are assembled such that the pressing member comes against the capacitive block to press it against the cooling system.

However, there is a misalignment risk between the pressing member and the capacitive block, which may decrease the pressing efficiency of the capacitive block. Guide pins between the pressing member and the first part of the chassis on the one hand, and on the capacitive block and the second part of the chassis on the other hand, and guide pins between the first part of the chassis and the second part of the chassis can be used. But this solution can be complex to make, because the power inverter comprises several other electrical devices, each having its own positioning requirements. All the alignments to be made makes up a requirement in manufacturing the power inverter, and more generally an electrical equipment.

There is thus a need for a means facilitating alignment of the pressing member with the electrical device it presses within an electrical equipment.

SUMMARY

To that end, the invention relates to an assembly including:
- at least one electrical device comprising a first face for being pressed against a surface,
- at least one pressing member positioned on a second face of the electrical device opposite to the first face, said pressing member being intended to participate in pressing said electrical device on said surface,
- at least one holding part which holds said pressing member on the second face of said electrical device by being attached around the pressing member on a peripheral portion of the electrical device.

By the use of the holding part, the pressing member is integrated on a face of the electrical device. The pressing member is thus assembled with the electrical device before being mounted on a chassis of an electrical equipment. Thus, misalignment problems are avoided upon mounting the electrical device in the chassis of the electrical equipment. The pressing member is thus held in place on the electronic device upon handling the assembly. Thus, for example, the holding part enables the pressing member to be held between a place where the assembly is assembled and another place where the assembly is mounted in the electrical equipment.

According to one embodiment, the edge of the holding part comes against the periphery of the electrical device so as to enclose the pressing member between the holding part and the electrical device. In particular, the holding part is only dedicated to the electrical device and only participates in holding the pressing member on the electrical device.

According to one alternative, the holding part comprises a wall forming a bottom and side walls extending from said bottom, said bottom and said side walls comprising the edge of the holding part. Thus, the bottom of the holding part protects the pressing member upon transporting and/or assembling the assembly.

According to one embodiment, the holding part defines an inner space between the bottom of the holding part and the second face of the electrical device. The pressing member is held in this inner space, by a cooperation of the holding part with the peripheral portion of the electrical device.

According to one embodiment, the pressing member is devoid of fasteners and is held against the electrical device only by the holding part coming around said pressing member. The attachment of the holding part around the pressing member avoids fasteners on the pressing member and thus allows a greater freedom in designing this pressing member.

According to one embodiment, the holding part is configured so as to transmit a first load to the pressing member when said electrical device is pressed against said surface by bearing through said holding part and said second face. In an electrical equipment comprising the assembly according to this embodiment, this first load is for example achieved by pressurising the assembly between a first part of a chassis of the electrical equipment and a second part of the chassis of the electrical equipment. The first part of the chassis comes against the first face of the electrical device and the second part of the chassis comes against the holding part. For example, once it is mounted in the electrical equipment, the electrical device is pressed on a surface, which forms in particular a surface of a cooling circuit. This enables a constant contact between the electrical device and the surface of the cooling circuit to be ensured. In particular, the holding part is moved or is deformed in order to transmit this first load to the pressing member.

According to one alternative, the holding part is configured so as to exert a second load, lower than the first load, on the pressing member so as to hold it against said second face of the electrical device, when the holding part is free of any external stress exerted on the holding part to said second face of the electrical device. For example, in phases of transporting and/or handling the assembly according to this alternative, before mounting in an electrical equipment, this second load exerted on the pressing member makes it possible to ensure that the pressing member does not move. This second load can be comparatively light, but it is preferably sufficient to keep the pressing member in place.

According to a particular alternative, the holding part comprises fasteners with the electrical device. The fasteners have a clearance such that a distal position of the holding part is achieved when the holding part is free of any external stress exerted on the holding part to said second face of the electrical device; and a proximal position of the holding part is achieved when the electrical device is pressed against the surface by bearing through said holding part and said second face. The clearance of the fasteners makes it possible to ensure that the holding part is movable enough to occupy the distal position or the proximal position.

According to one embodiment, the electrical device comprises at least one electrical conductor. The electrical conductor enables the electrical device to be connected, in particular to another electrical element. The electrical conductor extends at least in the second face of the electrical device. The holding part includes at least one first attachment member and the electrical conductor includes at least one second attachment member. The second attachment member cooperates with the first attachment member so as to hold the holding part on the electrical device. In other words, the second attachment member is integrated in the electrical conductor. Consequently, it is not necessary to secure a part on the electrical device and the manufacture is facilitated. For example, the second attachment member is an eyelet integrated to the electrical conductor. For example, the first attachment member includes at its end a hook cooperating with the eyelet.

According to one alternative embodiment, the electrical device can comprise a casing, a face of which extends at least in the second face of the electrical device. The holding part includes at least one first attachment member and the casing includes at least one second attachment member cooperating with the first attachment member so as to hold the holding part on the electrical device. The second attachment member is integrated in the casing. Consequently, it is not necessary to secure a part on the electrical device and the manufacture is facilitated. For example, the second attachment member is an eyelet integrated to the casing. For example, the first attachment member includes at its end a hook cooperating with the eyelet.

According to a particular alternative, the first attachment member is on one edge of the holding part and the second attachment member is on one edge of the second face of the electrical device, or the second attachment member is around the second face of the electrical device.

According to one embodiment, the holding part is of an electrically insulating material.

According to one alternative, the pressing member is electrically conducting and is directly in contact with the electrical conductor. The holding part is configured to electrically insulate the pressing member on its opposite side to the second face of the electrical device. The holding part enables the electrical device to be insulated with respect to an external environment on the side of the pressing member.

According to one embodiment, the assembly is for being mounted in an electrical equipment. The assembly is to be compressed between a first part of a chassis of the electrical equipment and a second part of the chassis of the electrical equipment through the pressing member and the second face.

According to one alternative, the assembly is to be compressed between a first part of a chassis of the electrical equipment and a second part of the chassis of the electrical equipment through the pressing member, the second face, and the bottom of the holding part.

According to one embodiment, the electrical device is a capacitive block.

The invention further relates to an electrical equipment comprising a chassis including a first part secured to a second part, and an assembly according to the invention. The assembly is compressed between the first part of the chassis and the second part of the chassis through the pressing member and the second face.

According to one alternative, the assembly is compressed between the first part of the chassis and the second part of the chassis through the pressing member and the second face, and the bottom of the holding part. The face of the bottom opposite to the pressing member thus comes against a wall of the second part of the chassis.

According to one alternative, the first part of the chassis comprises a cooling circuit.

BRIEF DESCRIPTION OF THE DRAWINGS

The invention will be better understood and further details, characteristics and advantages of the invention will appear upon reading the following description that follows by way of non-limiting example in reference to the appended figures in which.

It should be noted that the figures set out an example according to the invention in further detail to implement it, wherein said figures can of course be used to better define the invention if need be.

DETAILED DESCRIPTION

In the example represented by the figures, the electrical device is a capacitive block. However, the electrical device could be for example an inductive block or a resistive block, among other things.

Figure 1:
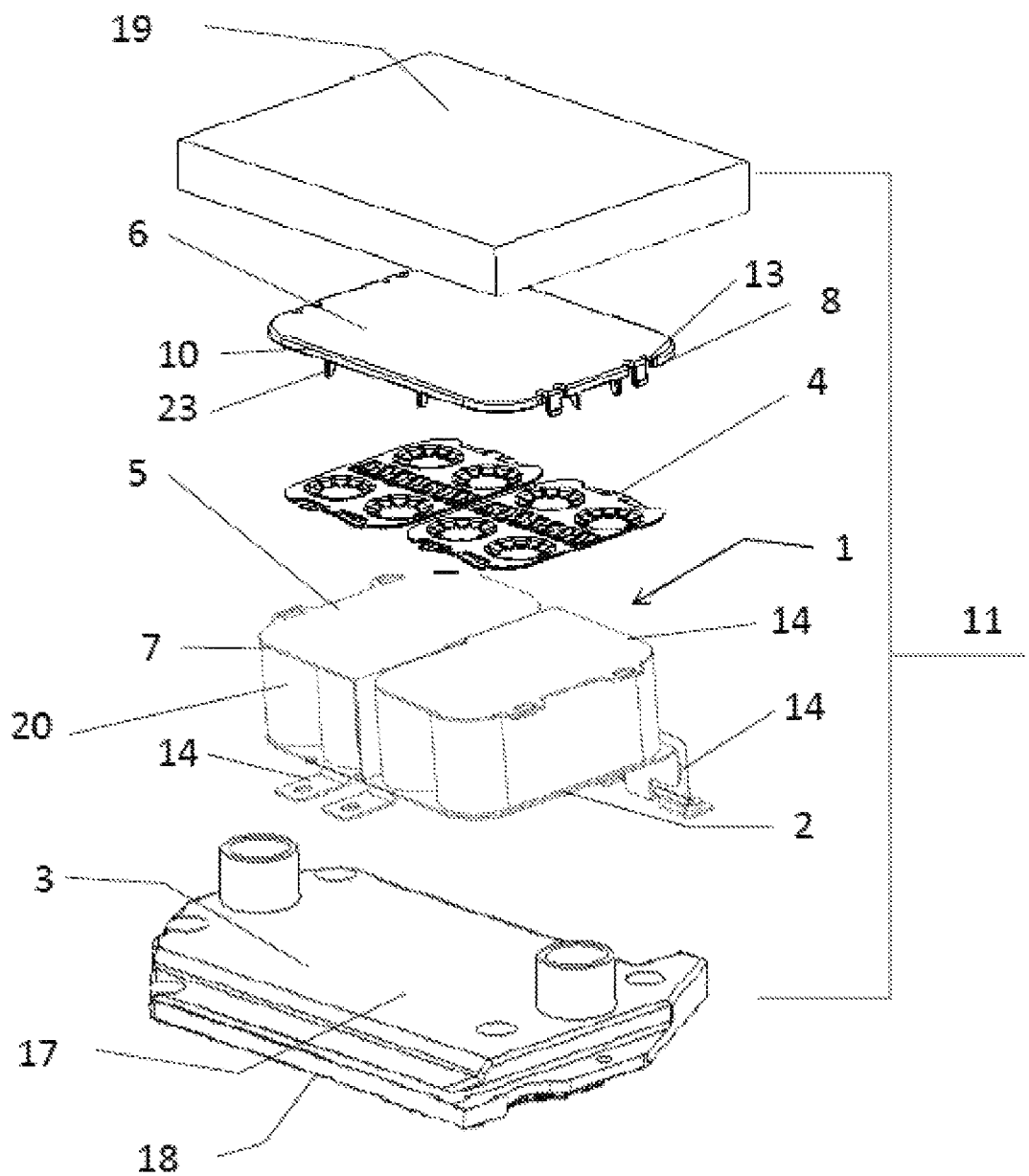
FIG. 1 is an exploded perspective view of an electrical equipment comprising an electrical device and a pressing member, according to one exemplary embodiment of the invention.

FIG. 1 shows a part of an electrical equipment 11, such as a part of a power inverter, in an exploded view. It is to be noted that the present invention is also applicable to other pieces of electrical equipment comprising a cooling circuit and an electrical device of which has to be pressed on this cooling circuit. The invention is also applicable for example in the case of an electrical charger or a DC-DC voltage converter.

Figure 2:
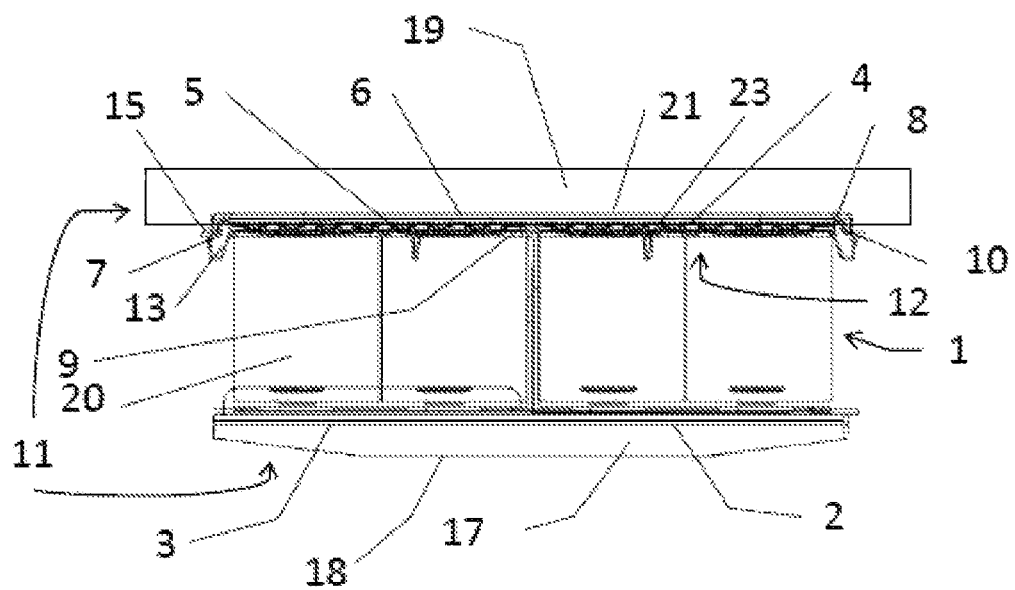
FIG. 2 is a cross-section view of an electrical equipment comprising an electrical device and a pressing member, according to one exemplary embodiment of the invention.

As represented in FIGS. 1 and 2, a pressing member 4, herein in two parts, is interposed between the electrical device 1, herein a capacitive block, and a holding part 6. The assembly is compressed by a first part 18 of the chassis and by a second part 19 of the chassis. The first part 18 of the chassis comprises in particular an integrated cooling circuit 17. Only one part of the cooling circuit 17 is represented.

The capacitive block 1 can comprise one or more capacitors 20. These capacitors 20 are for example sheets wound about an axis, in a coil shape. In the example illustrated in FIG. 1, several capacitors 20 are gathered together, the winding axes being parallel. Electrical conductors 14 are attached to each capacitor 20, in particular by welding, in order to be able to electrically connect the capacitive block 1. The electrical conductors 14 lie on terminals of the capacitor, which are opposite along the winding axis of the capacitor. The electrical conductors 14 and the capacitors 20 make up the faces 2, 5 of the electrical device 1. Heat generation by the capacitors 20 and the electrical conductors 14 can become significant. In order to prevent the different components, and thus the assembly, from overheating, a first face 2 of the device 1 is pressed on the cooling circuit 17. The cooling circuit 17 includes a surface 3, lying against the face 2 of the electrical device 1. The cooling circuit 17 prevents the electrical device 1 and its electrical conductors 14 from overheating. A constant contact, which extends on the entire face 2 of the electrical device, is preferable. Assembling both parts 18, 19 of the chassis applies a compression load of the electrical device 1 onto the cooling circuit 17.

In order to hold a permanent contact between the electrical device 1 and the cooling circuit 17, a pressing member 4 is arranged on a second face 5 of the electrical device 1, opposite to the first face 2 of the device 1. The pressing member 4 thereby presses the device 1 against the cooling circuit 17.

In order to avoid misalignment of the pressing member 4 and the electrical device 1, a holding part 6 is arranged on the pressing member 4. For example, the holding part 6 includes a wall forming a bottom 9 and side walls 10. The side walls 10 extend from the bottom 9 and comprise an edge 8 of the holding part 6. The holding part 6 thereby encompasses the pressing member 4 on its sides and along one face. On its opposite face, the pressing member 4 is laid on the electrical device 1. The bottom 9 and the side walls 10 enable said pressing member 4 to be fully covered, and thus to be protected from its environment upon handling the assembly.

Figure 3:
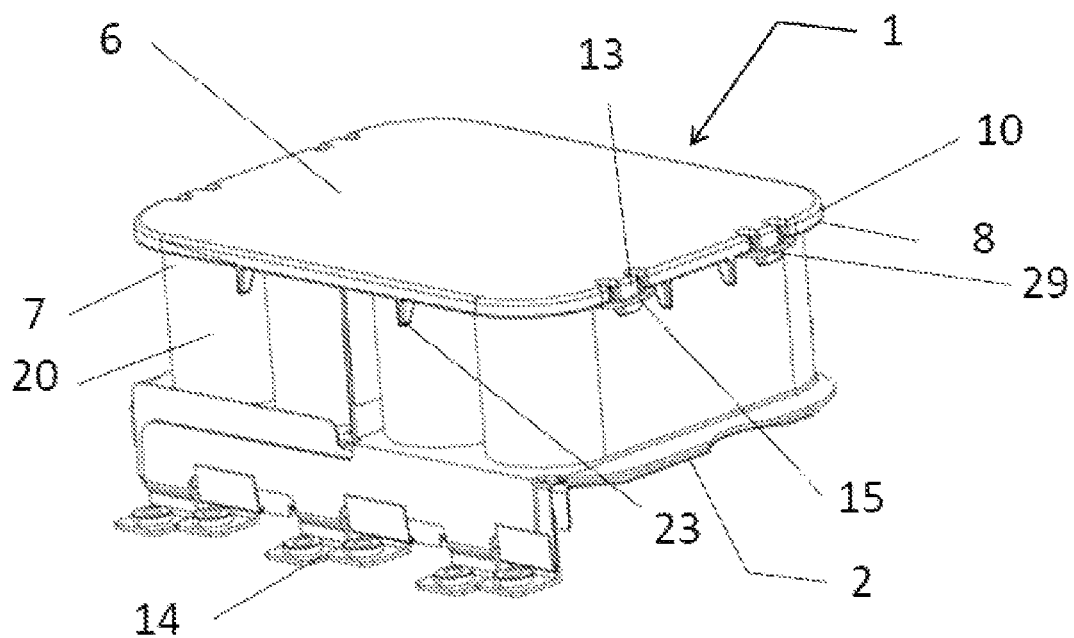
FIG. 3 is a perspective view of an electrical device with a holding part according to one exemplary embodiment of the invention.

In order to facilitate aligned mounting of the electrical device 1 with the pressing member, the pressing member 4 is already pre-assembled with the device 1 by the use of the holding part 6, as can be seen for example in FIG. 3. In this manner, the alignment of the pressing member 4 on the electrical device 1 is ensured. The electrical device 1 can not be moved in non-desirable directions, neither during the final assembling, nor in use.

Figure 4:
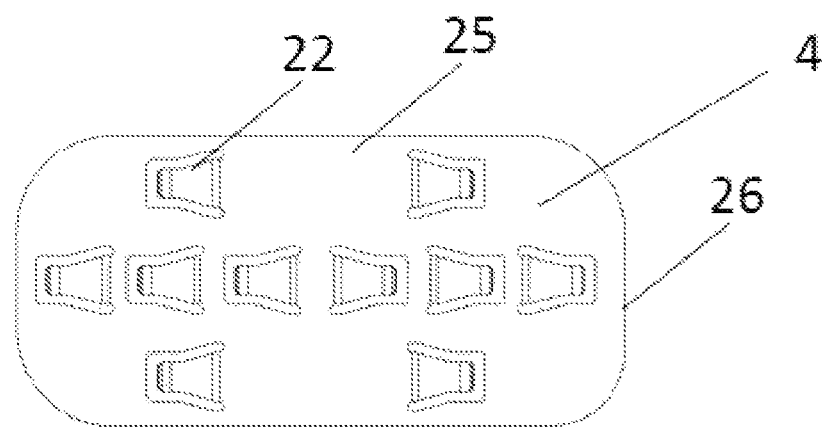
FIG. 4 is a top view of a pressing member as a single piece, according to one exemplary embodiment of the invention.
Figure 8:
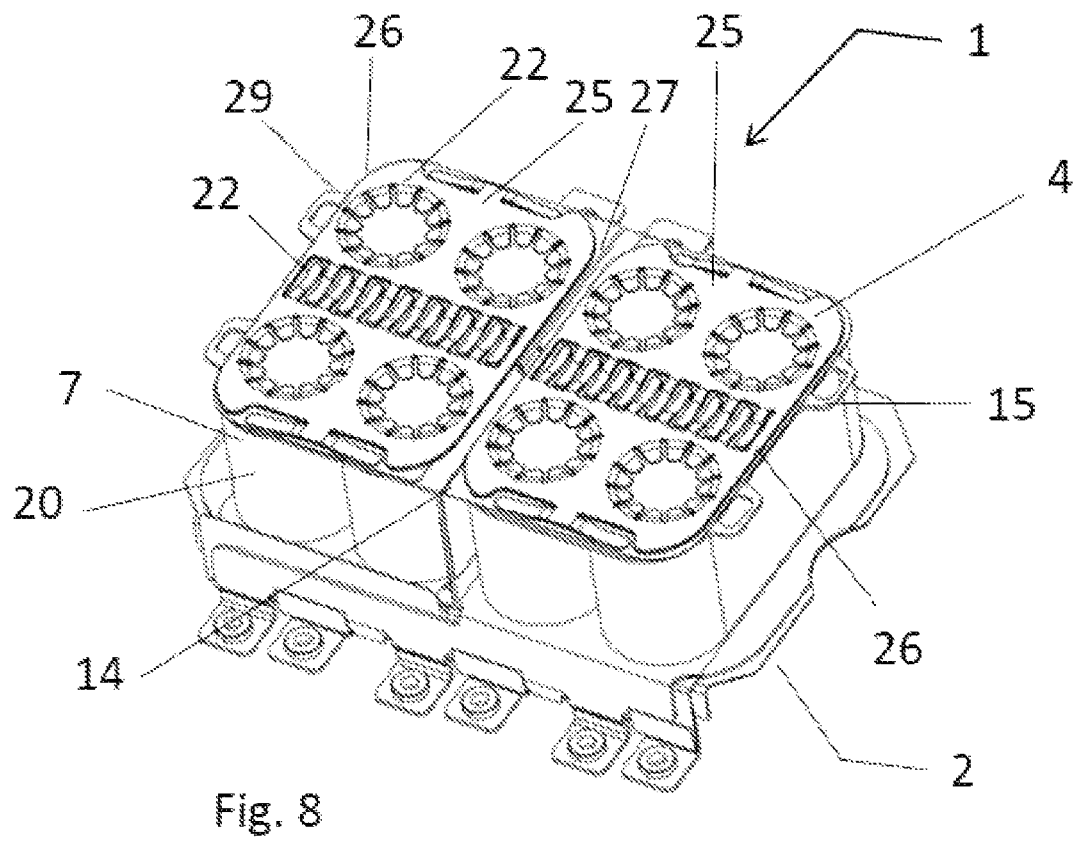
FIG. 8 is a perspective view of an electrical device without a holding part according to one exemplary embodiment of the invention.

As can be seen in FIGS. 4 and 8, the pressing member 4 can further comprise spring leaves 22. The spring leaves 22 extend away from the surface of the pressing member 4. These leaves 22 generate the load exerted by the pressing member 4 on the second face 5 of the electrical device 1, which will enable the electrical device 1 to be pressed on the surface 3 of the cooling circuit 17. The surface of the pressing member 4 is thus not uniform. To avoid undesirable deformations of the pressing member 4, a protection is preferable.

Upon transporting the electrical device 1 for the purpose of a final assembling, the holding part 6 holds the pressing member 4 in place and protects it in the meantime.

Figure 5:
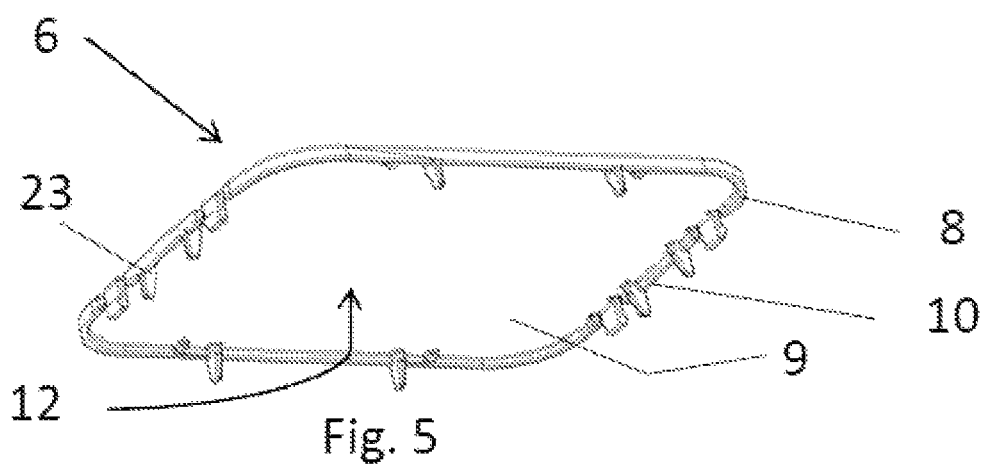
FIG. 5 is a perspective view of a holding part, according to one exemplary embodiment of the invention.
Figure 6:
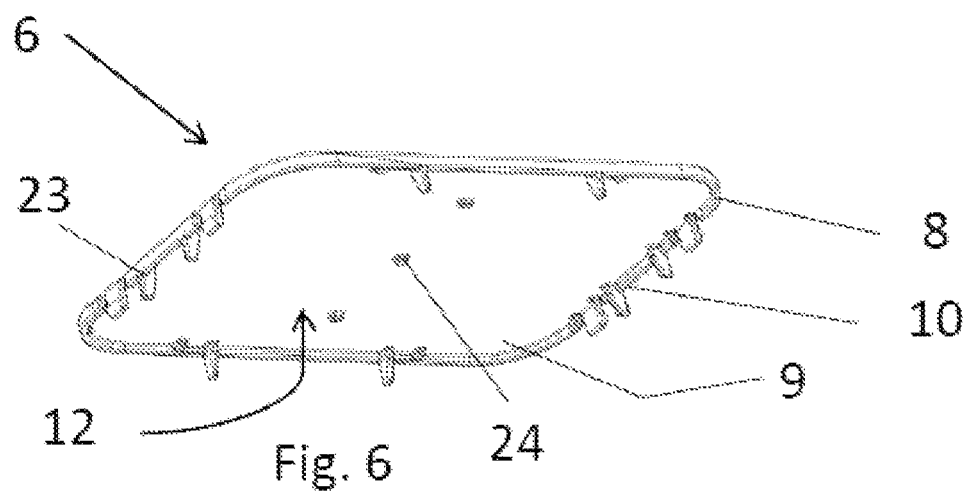
FIG. 6 is a perspective view of another holding part, according to one exemplary embodiment of the invention.
Figure 7:
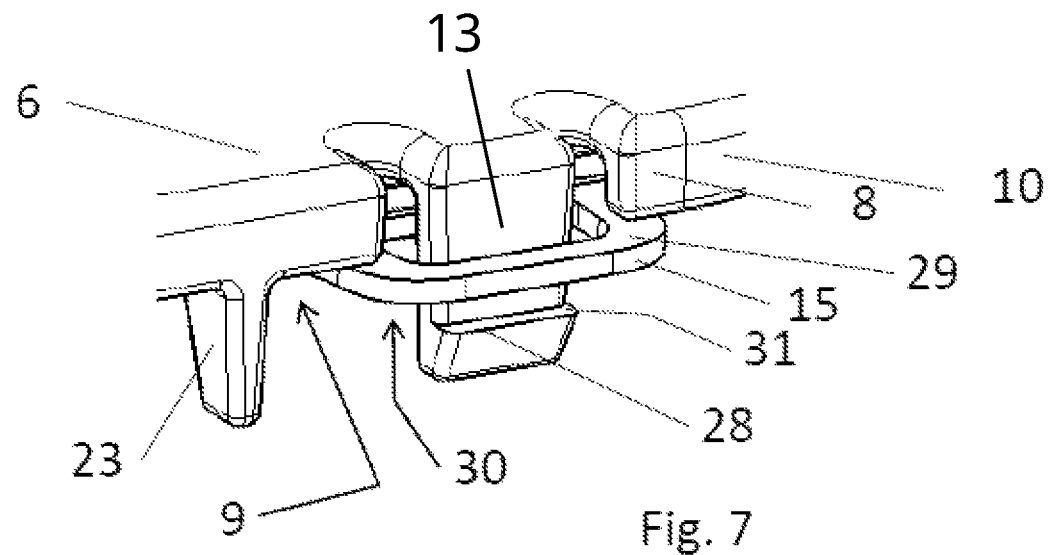
FIG. 7 is a detail view of an electrical device assembled with a pressing member, according to one exemplary embodiment of the invention.

The holding part 6 thus has to fulfil several technical requirements. In FIGS. 5, 6 and 7, a holding part 6 is illustrated, in an overall and a detail view. The holding part 6 comprises a bottom wall 9 and side walls 10 extending from the bottom 9. The bottom 9 and the side walls 10 comprising the edge 8 of the holding part 6. Throats 23 extend from the bottom 9, along the side walls 10, and protrude from the edge 8. The throats 23 have an essentially triangular shape, tapering away from the bottom. The ends of the throats 23 are rounded, in order to avoid bumps. Since they are arranged all around the holding part 6, a funnel effect allows an easy and targeted placement upon assembling the holding part 6 on the pressing member 4 and the electrical device 1. The throats 23 located on a side of the holding part 6 cooperate with throats 23 located on the opposite side of the holding part 6. Given that a symmetric distribution is not necessary, at least one throat 23 is preferable on each side. However, two throats 23 per side facilitate arrangement. The first fasteners 13, described later, can also be used as a throat 23.

The pressing member 4 can be comprised of a single spring plate 25, as illustrated in FIG. 4 or it can be comprised of several spring plates 25 as illustrated in FIG. 8 for example.

The holding part 6, illustrated by FIG. 5 is provided to protect and encompass a pressing member 4 of a single spring plate 25. The pressing member 4 extends in this case on the entire second face 5 of the electrical device 1. The bottom 9 of the holding part 6 can thus be smooth, the positioning of the pressing member 4 is thus made by the edge of the holding part 6, matching with an edge 26 of the pressing member 4. Between the pressing member 4 and the electrical device 1, an insulation layer can be arranged. This insulation layer prevents a short-circuit between the pressing member 4 and the electrical device 1, in particular between the pressing member 4 and the electrical conductors 14. The insulation layer can be a sheet of insulating material.

The holding part 6, illustrated by FIG. 6 is provided to protect and encompass a pressing member 4 comprised of several spring plates 25, herein two spring plates 25. The spring plates 25 cover in this case together the second face 5 of the electrical device 1. In order to avoid a possible overlapping of the spring plates 25, the holding part 6 includes protrusions 24, arranged at the interval 27 between both spring plates 25. The extent of the protrusions 24 has to correspond to the clearance of the fasteners 13, 15 described subsequently. Positioning the pressing member 4 is thereby ensured by the edge 8 of the holding part 6, cooperating with the edge of the pressing member 26 and by the protrusions 24 cooperating with the interval 27 between both spring plates 25. The assembly can be free of electrically insulating layer between the pressing member 4 and the electrical device 1, in particular between the pressing member 4 and the electrical conductors 14. In this case, the holding part 6 can ensure electrical insulation of the electrical device 1 towards the environment. The holding part 6 is thus of a dielectric material.

In the example shown, the holding part 6 fully covers the pressing member 4. However, it is also possible that the holding part 6 only partly covers the pressing member.

Figure 9:
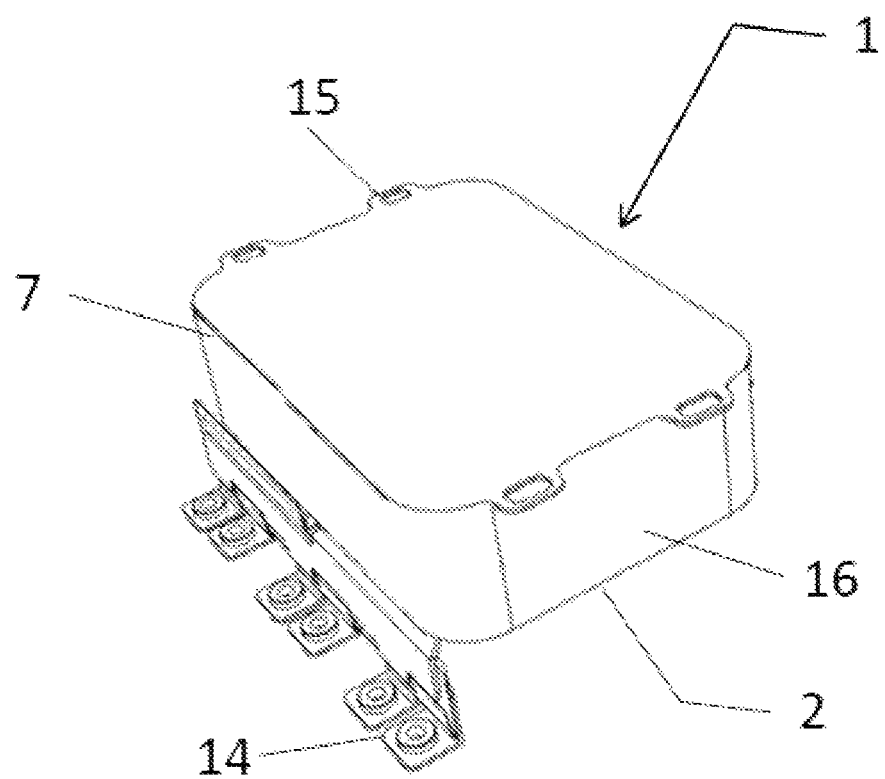
FIG. 9 is a perspective view of an electrical device comprising a casing, according to one exemplary embodiment of the invention.

As illustrated by FIG. 3, fasteners 13, 15 are used to attach the holding part 6 on the electrical device 1. A fastener comprises in particular a first 13 and a second 15 attachment member. To attach the holding part 6 on the electrical device 1, the first attachment member 13 is located on one edge 8 of the holding part 6. The second attachment member 15 is located on a peripheral portion 7 of the electrical device 1, in particular on one edge of the second face 5 of the electrical device 1 or around the second face 5 of the electrical device 1. In the exemplary embodiment of the invention illustrated by the figures, the first attachment member 13 is in particular a protrusion extending from the bottom 9 of the holding part 6, along the side walls 10, with a hook-shaped heel 28. The second attachment member 15 is in particular eyelet-shaped 29. Upon assembling the holding part 6 on the electrical device 1, the hook 28 is locked into the eyelet 29. The eyelets 29 can be integrated, as illustrated by FIG. 8, directly to the electrical conductors 14. However, in the case where the electrical device 1 includes a casing 16, as illustrated by FIG. 9, the eyelets can be integrated in this casing 16. In particular, the eyelet 29 is included in the second face 5 of the electrical device 1. However, the eyelet 29 could be offset with respect to the second face 5, on a side wall of the electrical device 1.

FIG. 7 represents a fastener 13, 15 in further detail. The hook 28 is introduced through a side of the eyelet 29 so as to attach the holding part 6 on the electrical device 1. The hook 28 is thereby locked into the eyelet 29. The hook 28 includes a portion 31 which faces a fastener surface 30 of the eyelet 29. The portion 31 and the fastener surface 30 of the eyelet 29 cooperate to allow holding of the hook 28 in the eyelet 29.

When the hook is introduced in the eyelet 29, a distance separates the eyelet 29 from the edge 8 or the bottom 9 of the holding part 6. Accordingly, the fastener 13, 15 has a clearance. The holding part 6 can thus be more or less close to the electrical device 1, as a function of the load exerted thereto. For example, in a first position, the holding part 6 is free of any stress coming from its external face. The holding part 6 undergoes a reaction from the pressing member 4, which pushes back the holding part 6. The portion 31 of the hook 28 comes in contact with the fastener surface 30 and holds the holding part 6 as well as the pressing member 4 in position on the electrical device 1. The holding part 6 is thereby located in a distal position with respect to the electrical device 1.

Upon mounting the assembly, including the electrical device 1, the pressing member 4 and the holding part 6, between both parts 18, 19 of the chassis, a load will be exerted on the electrical device 1, in order to press the first face 2 of the electrical device 1 on the surface 3 of the cooling circuit 17. To that end, the second part 19 of the chassis bears on the holding part 6, in particular on the outer face of the holding part 6 opposite to the pressing member 4. The bottom 9 of the holding part 6 moves closer to the electrical device 1. The throats 23 are in particular configured to cooperate with the peripheral portion 7 of the electrical device 1 so as to guide the holding part 6 to the second face 5 of the electrical device 1. The pressing member 4 is thus compressed, allowing pressing of the first face 2 of the device 1 on the first part 18 of the chassis. The portion 31 of the hook 28 is no longer in contact with the fastener surface 30. A proximal position of the holding part 6 with respect to the electrical device 1 is thereby achieved. FIG. 7 illustrates the proximal position of the holding part 6.

In particular, in its distal position, the holding part 6 exerts however a load on the pressing member 4 in order to avoid a side displacement of the pressing member 4. This load is thus low with respect to that exerted on the pressing member 4 when the assembly is mounted between both parts 18, 19 of the chassis.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. An assembly including:
   at least one electrical device comprising a first face for being pressed against a surface,
   at least one pressing member positioned on a second face of the electrical device opposite to the first face, said pressing member being intended to participate in pressing said electrical device on said surface,
   at least one holding part which holds said pressing member on the second face of said electrical device by being attached around the pressing member to a peripheral portion of the electrical device,
   wherein said holding part is configured so as to transmit a first load to the pressing member when said electrical device is pressed against said surface by bearing through said holding part and said second face, and
   wherein said holding part is configured so as to exert a second load, lower than the first load, on the pressing member so as to hold it against said second face of the electrical device, when the holding part is free of any external stress exerted on the holding part to said second face of the electrical device.

2. The assembly according to claim 1, wherein an edge of the holding part comes against the periphery of the electrical device so as to enclose the pressing member between the holding part and the electrical device.

3. The assembly according to claim 2, wherein the holding part comprises a wall forming a bottom and side walls extending from said bottom, said bottom and said side walls comprising the edge of the holding part.

4. The assembly according to claim 1, wherein said holding part comprises fasteners with the electrical device, said fasteners having a clearance such that:
   a distal position of the holding part is achieved when the holding part is free of any external stress exerted on the holding part to said second face of the electrical device, and
   a proximal position of the holding part is achieved when said electrical device is pressed against said surface by bearing through said holding part and said second face.

5. The assembly according to claim 4, wherein the electrical device comprises at least one electrical conductor enabling the electrical device to be connected, said electrical conductor extending at least in said second face of the electrical device,
   and wherein the holding part includes at least one first attachment member and the electrical conductor includes at least one second attachment member cooperating with said first attachment member so as to hold the holding part on the electrical device.

6. The assembly according to claim 1, wherein the electrical device comprises a casing,
and wherein the holding part includes at least one first attachment member and said casing includes at least one second attachment member cooperating with said first attachment member so as to hold the holding part on the electrical device.

7. The assembly according to claim 5, wherein the holding part is of an electrically insulating material.

8. The assembly according to claim 7, wherein the pressing member is electrically conducting and is directly in contact with said electrical conductor, and said holding part is configured to electrically insulate said pressing member on its opposite side to the second face of the electrical device.

9. The assembly according to claim 8, for being mounted in an electrical equipment, the assembly being intended to be compressed between a first part of a chassis of the electrical equipment and a second part of the chassis of the electrical equipment through the pressing member and the second face.

10. The assembly according to claim 9 wherein the assembly is for being compressed between a first part of a chassis of the electrical equipment and a second part of the chassis of the electrical equipment through the pressing member, the second face, and the bottom of the holding part.

11. An electrical equipment comprising:
a chassis including a first part secured to a second part, and
an assembly according to claim 10,
wherein the assembly is compressed between the first part of the chassis and the second part of the chassis through the pressing member and the second face.

12. The electrical equipment according to claim 11, comprising an assembly according to claim 3, wherein the assembly is compressed between the first part of the chassis and the second part of the chassis through the pressing member and the second face, and the bottom of the holding part.

13. The assembly according to claim 1, wherein the electrical device comprises at least one electrical conductor enabling the electrical device to be connected,
and wherein the holding part includes at least one first attachment member and the electrical conductor includes at least one second attachment member cooperating with said first attachment member so as to hold the holding part on the electrical device.

14. The assembly according to claim 2, wherein the electrical device comprises at least one electrical conductor enabling the electrical device to be connected, said electrical conductor extending at least in said second face of the electrical device,
and wherein the holding part includes at least one first attachment member and the electrical conductor includes at least one second attachment member cooperating with said first attachment member so as to hold the holding part on the electrical device.

15. The assembly according to claim 3, wherein the electrical device comprises at least one electrical conductor enabling the electrical device to be connected, said electrical conductor extending at least in said second face of the electrical device,
and wherein the holding part includes at least one first attachment member and the electrical conductor includes at least one second attachment member cooperating with said first attachment member so as to hold the holding part on the electrical device.

* * * * *